US007042252B2

(12) United States Patent
Galloway et al.

(10) Patent No.: US 7,042,252 B2
(45) Date of Patent: May 9, 2006

(54) CORRECTING FOR DC OFFSET IN A PHASE LOCKED LOOP

(76) Inventors: Brian Jeffrey Galloway, 785 W. Latimer Ave., Campbel, CA (US) 95008; Gunter Willy Steinbach, 4267 Pomona Ave., Palo Alto, CA (US) 94306

( * ) Notice: Subject to any disclaimer, the term of this patent is extended or adjusted under 35 U.S.C. 154(b) by 6 days.

(21) Appl. No.: 10/830,998

(22) Filed: Apr. 23, 2004

(65) Prior Publication Data
US 2005/0237086 A1    Oct. 27, 2005

(51) Int. Cl.
*H03K 5/00*    (2006.01)
(52) U.S. Cl. .................... 327/16; 327/156; 327/163
(58) Field of Classification Search ............ 327/16, 327/147, 150, 159, 154–156, 162, 163; 331/25, 331/1 R, DIG. 2; 375/375, 376
See application file for complete search history.

(56) References Cited

U.S. PATENT DOCUMENTS

| | | | | |
|---|---|---|---|---|
| 4,105,975 | A * | 8/1978 | Sanders et al. ............. | 375/346 |
| 5,012,494 | A * | 4/1991 | Lai et al. ................... | 375/376 |
| 5,757,857 | A * | 5/1998 | Buchwald ................... | 375/271 |
| 5,757,868 | A * | 5/1998 | Kelton et al. ............... | 375/360 |
| 6,178,213 | B1 * | 1/2001 | McCormack et al. ........ | 375/355 |
| 6,337,650 | B1 | 1/2002 | Mitsutani ..................... | 341/155 |
| 6,392,457 | B1 * | 5/2002 | Ransijn ........................ | 327/156 |
| 6,404,363 | B1 | 6/2002 | Park et al. .................. | 341/110 |
| 6,462,593 | B1 * | 10/2002 | Wu et al. ..................... | 327/156 |
| 6,463,109 | B1 * | 10/2002 | McCormack et al. ....... | 375/355 |
| 6,628,112 | B1 * | 9/2003 | Pisipaty ..................... | 324/76.53 |
| 6,680,654 | B1 * | 1/2004 | Fischer et al. ................ | 331/17 |
| 6,737,995 | B1 * | 5/2004 | Ng et al. ...................... | 341/68 |
| 2002/0021470 | A1 | 2/2002 | Savoj ......................... | 398/155 |
| 2003/0007222 | A1 | 1/2003 | Kwasaki et al. ............ | 398/202 |
| 2004/0062336 | A1 | 4/2004 | Kuwata et al. ............. | 375/376 |

OTHER PUBLICATIONS

Alexander, J.D.H., "Clock Recovery from Random Binary Signals", Electronic Letters vol. 11, pp. 541-542, Oct. 30, 1975.
T. Hu, P. Gray, "A Monolithic 480Mb/s Parallel AGC/Decision/Clock Recovery Circuit in 1.2um CMOS", IEEE Journal of Solid-State Circuits, pp. 681-690, Dec. 1993.
M.J.E. Lee, W. Dally, P. Chiang, "A 90mW 4Gb/s Equalized I/O Circuit with Input Offset Cancellation", ISSCC Digest of Technical Papers, pp. 252-253, Feb. 2000.

* cited by examiner

*Primary Examiner*—Timothy P. Callahan
*Assistant Examiner*—Hai L. Nguyen

(57) ABSTRACT

A technique for correcting for DC offset in a phase locked loop involves generating digital phase information in response to an input signal and then generating an offset correction signal in response to the digital phase information. The digital phase information may include transition samples that are integrated to generate the offset correction signal. Integrating the transition samples helps to compensate for the effects of phase noise, especially phase noise that is contributed by the input signal and/or the recovered clock signal.

17 Claims, 8 Drawing Sheets

CORRECTING FOR DC OFFSET IN A PHASE LOCKED LOOP

BACKGROUND OF THE INVENTION

Clock and data recovery (CDR) circuits are widely used when a data signal is sent across a communications link without an accompanying dedicated clock signal. CDR circuits typically use a phase-locked loop (PLL) to determine, from the transitions between physical data values, the exact frequency at which data is arriving and the optimum phase at which to sample the incoming data. A typical PLL includes a phase detector, a loop filter, and a voltage controlled oscillator (VCO) that produces a VCO signal. The phase detector compares an input signal with a portion of the VCO signal and produces an output that indicates the relative phase of the two signals. The output is provided to the loop filter and in response, the loop filter produces a voltage that causes the phase of the VCO signal to move closer to the input signal. A portion of the VCO signal is then looped back to the phase detector in a continuous process. When the loop is locked, the frequency and phase of the VCO signal track the frequency and phase of the input signal.

A central component in ensuring signal lock is the phase detector. There are generally two classes of phase detectors, analog and digital. Digital phase detectors (also referred to as "binary," "up/down," or "bang-bang" phase detectors) compare the phase of the input and VCO signals and output a binary indication of the relative phase of the two signals (i.e., whether the recovered VCO signal is early or late). The indication of the relative phase is typically provided as binary early and late signals.

Transmitting data across a communication link tends to cause the digital phase detector to experience a direct current (DC) offset. If the DC offset grows too large, it can negatively affect the performance of the PLL. One technique that has been used to compensate for DC offset involves using DC feedback around an input amplifier to insure that the input amplifier presents data to the sampling mechanism of the digital phase detector with a DC component that has been reduced by the gain of the feedback loop. Drawbacks to this approach include that it does not correct for the offset of the sampler and it requires balanced data (i.e., data with equal numbers of ones and zeros). Even with data that is statistically balanced, the low pass filter in the PLL must have a very long time constant (which often means it is physically large) to be immune to running disparities in the data. Another technique that has been used to compensate for DC offset involves using a sampling mechanism whose offset can be trimmed. This technique requires the input to the sampling mechanism to be removed from the data and the differential inputs be shorted in order to measure and adjust for the offset, which is not always possible or practical.

In view of this, what is needed is a technique for correcting for DC offset in a PLL circuit that provides the desired performance and is efficient to implement.

SUMMARY OF THE INVENTION

A technique for correcting for DC offset in a phase locked loop involves generating digital phase information in response to an input signal and then generating an offset correction signal in response to the digital phase information. Generating an offset correction signal in response to digital phase information can be implemented without large circuits and does not require DC balanced data. The digital phase information may include transition samples that are integrated to generate the offset correction signal. Integrating the transition samples helps to compensate for the effects of phase noise, especially phase noise that is contributed by the input signal and/or the recovered clock signal.

BRIEF DESCRIPTION OF THE DRAWINGS

Throughout the description similar reference numbers are used to identify similar elements.

DETAILED DESCRIPTION

Figure 1:
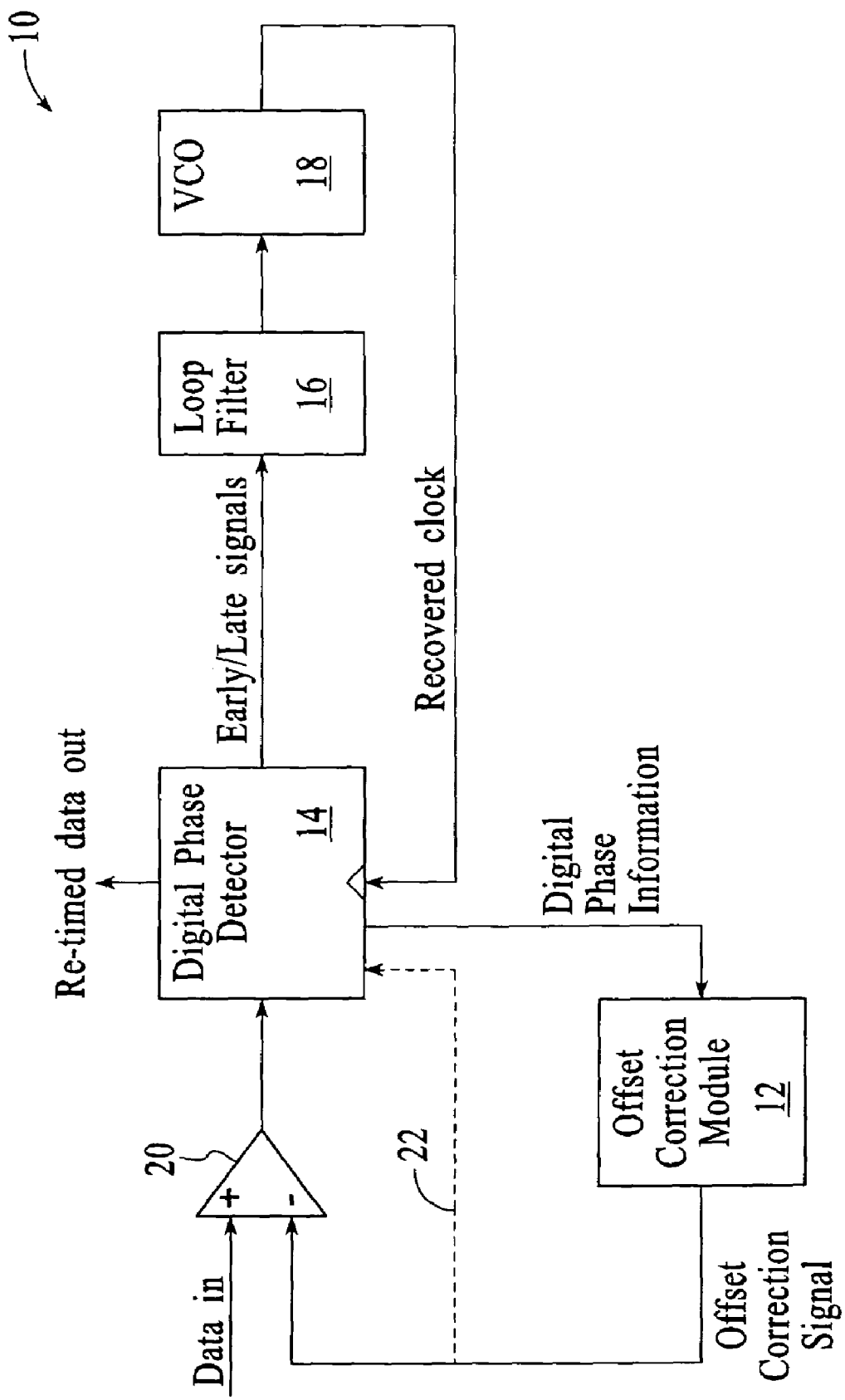
FIG. 1 depicts a phase locked loop (PLL) and an offset correction module in accordance with the invention.

Correcting for DC offset in a phase locked loop involves generating digital phase information in response to an input signal and then generating an offset correction signal in response to the digital phase information. FIG. 1 depicts a phase locked loop (PLL) 10 and an offset correction module 12 in accordance with the invention. The PLL includes a digital phase detector 14, a loop filter 16, and a VCO 18. In the embodiment of FIG. 1, the offset correction module is connected to receive digital phase information from the digital phase detector and to provide an offset correction signal to an input amplifier 20. Alternatively, the offset correction module could provide the offset correction signal directly to the digital phase detector (as indicated by dashed line 22) if there is no input amplifier or if direct control of the digital phase detector is preferred. In operation, the digital phase detector generates digital phase information in response to an input signal (labeled as "data in" in the figures) and the digital phase information is provided to the offset correction module. The offset correction module generates the offset correction signal in response to the digital phase information. The offset correction signal is then used to adjust the offset in the PLL. Correcting for DC offset in response to digital phase information from the digital phase detector 14 instead of using DC feedback or trimming a sampler does not require large circuits and can be implemented without relying on DC balanced data.

Figure 2:
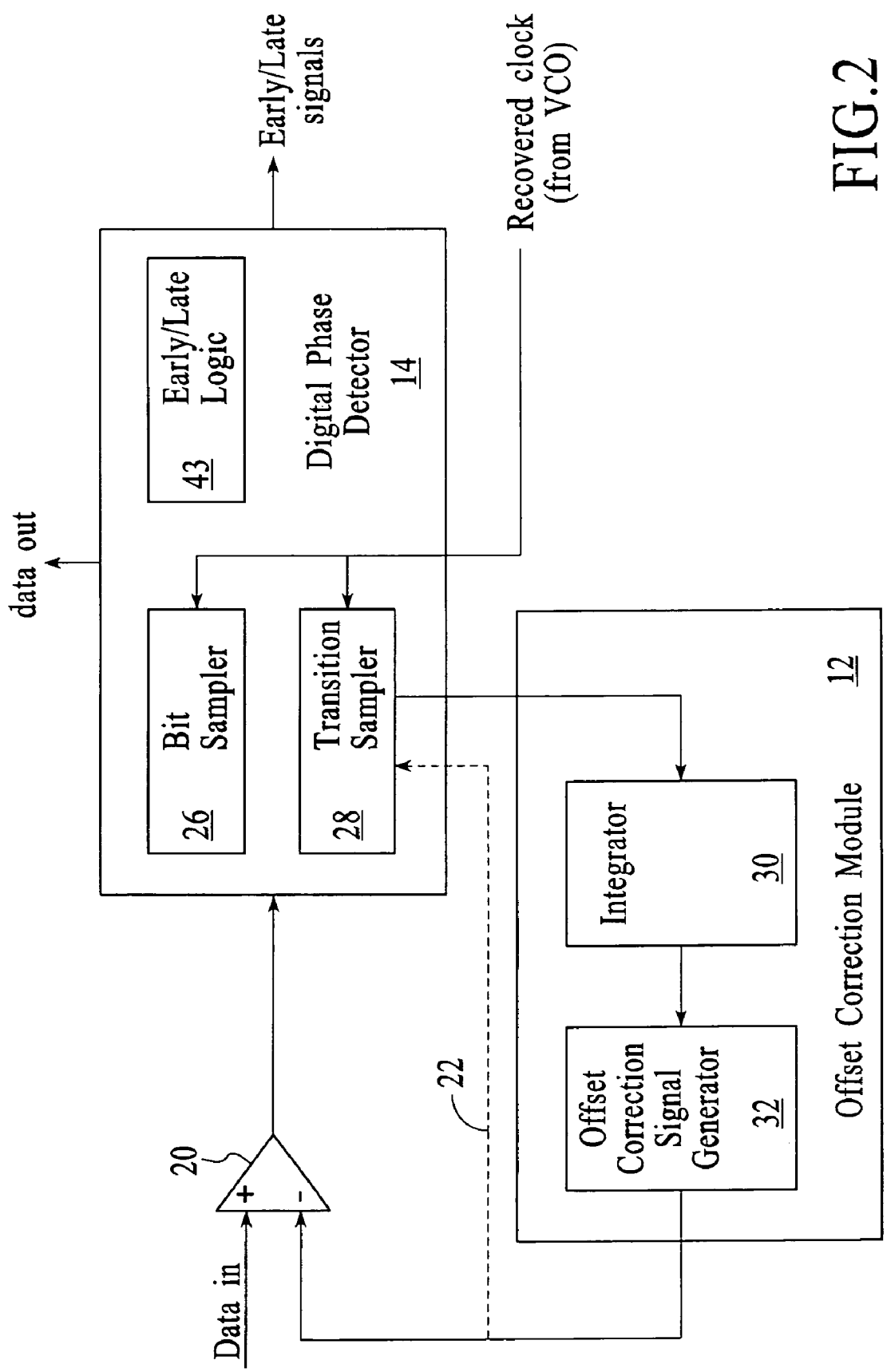
FIG. 2 depicts an expanded view of the digital phase detector and the offset correction module from FIG. 1.

FIG. 2 depicts an expanded view of the digital phase detector 14 and the offset correction module 12 from FIG. 1. In the expanded view of FIG. 2, the digital phase detector includes a bit sampler 26, a transition sampler 28, and early/late logic 43. The bit sampler and transition sampler sample the input signal using the clock signal that is recovered by the PLL. In particular, the bit sampler samples two consecutive data bits of the input signal and the transition sampler samples the transition between the two data bits. The bit and transition samples are compared to each other by the early/late logic to generate "early" and "late" signals that are used to adjust the VCO signal. Bit and transition samplers in digital phase detectors are well known in the field and are described in more detail below.

The offset correction module 12 includes an integrator 30 and an offset correction signal generator 32. The integrator receives the transition samples from the transition sampler 28 and integrates the transition samples. For example, integration of the transition samples involves accumulating the values of the transition samples over a pre-established time interval. The integrator generates an integration output signal that is used by the offset correction signal generator to generate an offset correction signal. The offset correction signal is then applied to the input amplifier 20 to correct for the DC offset in the PLL. That is, the offset correction signal adjusts the offset of the amplifier to compensate for the system offset. Alternatively, the offset correction signal can be provided directly to the transition sampler (as indicated by the dashed line 22) to correct for the DC offset. For example, the offset correction signal can be used to adjust an offset correction voltage that is applied to the transition sampler. The transition samples are integrated to compensate for the effects of phase noise, especially phase noise that is contributed by the input signal and/or the recovered clock signal. The effects of phase noise are described in more detail below.

Figure 3:
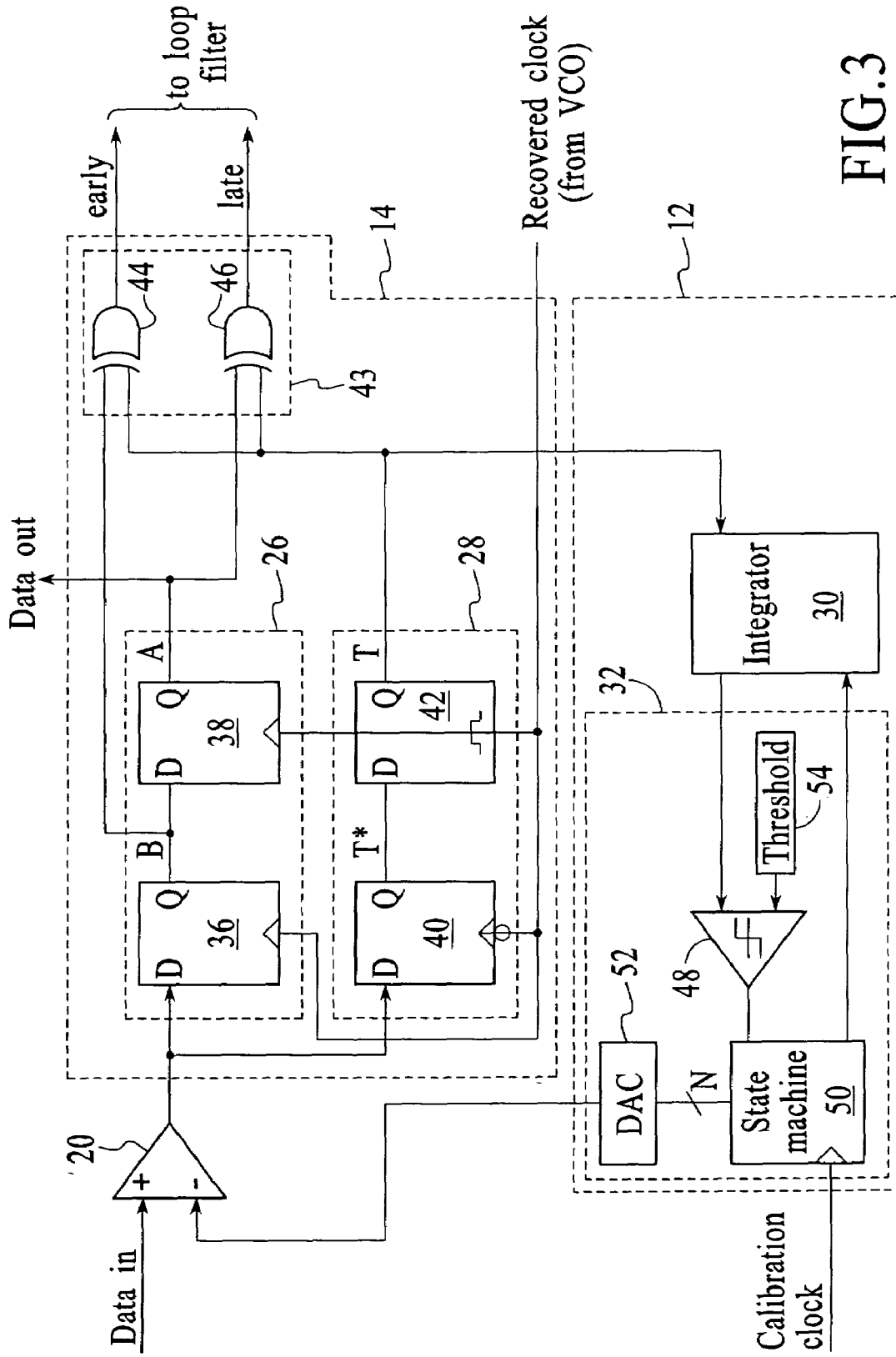
FIG. 3 depicts an expanded view of the digital phase detector and the offset correction module from FIG. 2.

FIG. 3 depicts an expanded view of the digital phase detector 14 and the offset correction module 12 from FIG. 2. In the depiction of FIG. 3, the bit sampler 26 of the digital phase detector includes two master-slave flip-flops 36 and 38 that sample consecutive data bits of the input signal with the true form of the recovered clock signal. The transition sampler 28 includes a master-slave flip-flop 40 that samples the transition with the complemented form of the recovered clock signal and a latch 42 that samples the transition with the true form of the recovered clock. The combination of the master-slave flip-flop and the latch of the transition sampler provide a half bit delay to the transition sample that aligns the transition sample with the bit samples. The outputs of the bit sampler and the transition sampler are provided to the early/late logic 43 that includes two XOR gates 44 and 46. The XOR gates provide the early and late signals to the loop filter 16. The output of the transition sampler is also provided to the offset correction module 12.

Referring to the offset correction module 12 in FIG. 3, the integrator 30 functions as described above with reference to FIG. 2. As depicted in FIG. 3, the offset correction signal generator 32 includes a comparator 48, a state machine 50, and a digital-to-analog converter (DAC) 52. The comparator is connected to compare the integration output signal from the integrator 30 to a pre-established threshold value 54. The output of the comparator is provided to the state machine. The state machine increments or decrements at each cycle of a calibration clock depending on the sign of the comparator.

The digital output of the state machine is provided to the DAC. The DAC generates an analog offset correction signal in response to the digital output from the state machine. The analog offset correction signal is used to adjust the amplifier 20.

Operation of the digital phase detector 14 is described first, including a description of the transition sampling and the effects that DC offset and phase noise have on the resulting transition samples. The description of the digital phase detector operation is followed by a description of the offset correction module operation 12, including how the offset correction module uses the transition samples to correct the DC offset while compensating for the effects of phase noise on the transition samples.

With reference to FIG. 3, the digital phase detector 14 samples the input signal with the recovered clock signal that comes from the VCO. The input signal is sampled on both the rising and falling edges of the recovered clock signal, such that each cycle of the input signal is sampled twice per clock period. When the PLL is locked, the input signal is sampled once in the middle of the data bit and once at the transition. The bit sampler 26 samples the input signal in the middle of the data bit and the transition sampler 28 samples the input signal at the transition. In order to generate early and late information, the bit sampler actually samples two consecutive bits of the input signal. The consecutive samples that are output from the bit sampler are referred to as the previous bit sample (A) and the next bit sample (B) and the output of the transition sampler is referred to as the transition sample (T). The samples may also be referred to simply as samples "A," "B," and "T." The early and late signals are generated by comparing a transition sample (T) to bit samples (A) and (B). For example, the XOR gates 44 and 46 compare the transition sample (T) with the surrounding bit samples (B) and (A), respectively, and provide early and late information to the loop filter.

Figure 4:
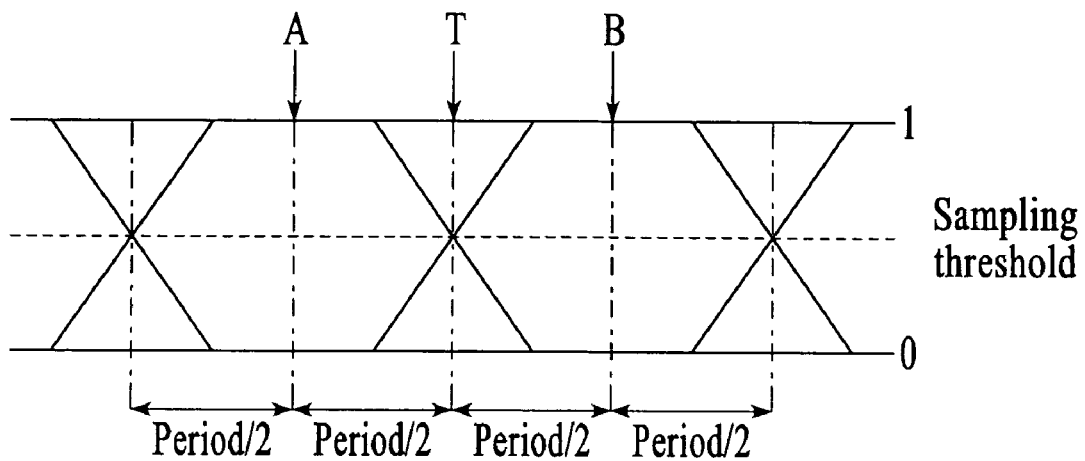
FIG. 4 illustrates an eye diagram of phase detector sample timing, including the steady state sampling locations of bit samples (A) and (B) and transition sample (T).

FIG. 4 illustrates an eye diagram of the phase detector sample timing, including the steady state sampling locations of the bit samples (A) and (B) and the transition sample (T). As illustrated in FIG. 4, the sample locations of A relative to T and T relative to B are separated by half of a period of the recovered clock signal. In multi-phase systems, the data and transitions could be sampled at different phases of the recovered clock signal, but would still maintain a half bit period separation.

The output logic of the digital phase detector from FIG. 3 is shown in Table 1. When there is a transition between the A and B samples (e.g., from "1" to "0" or from "0" to "1"), the value of A will be different than B. The value of the transition sample (T) indicates whether the phase of the recovered clock signal is early or late relative to the input signal. For example, if the A sample is "1" and the B sample is "0," then the transition sample will resolve to a "1" if the transition sample is early (e.g., to the left of the transition sampling location in FIG. 4). The early indication will cause the VCO to slow down, which drives the phase of the recovered clock signal (and therefore the transition sampling location) back to the right. The above-described example is illustrated at row G of Table 1. On the other hand, with the same values for A and B (A=1 and B=0), the transition sample will resolve to a "0" if the transition sample is late (e.g., to the right of the transition sampling location in FIG. 4). The late indication will cause the VCO to speed up, which drives the phase of the recovered clock signal (and therefore the transition sampling location) back to the left, see row E of Table 1. Ultimately, the sampling and accompanying logic drives the phase of the sampling point back towards the desired transition sampling point, T.

TABLE 1

Digital phase detector output logic

| Row | A | T | B | Early (B⊕T) | Late (A⊕T) | Result |
|---|---|---|---|---|---|---|
| A | 0 | 0 | 0 | 0 | 0 | Tristate |
| B | 0 | 0 | 1 | 1 | 0 | Down |
| C | 0 | 1 | 0 | 1 | 1 | Tristate |
| D | 0 | 1 | 1 | 0 | 1 | Up |
| E | 1 | 0 | 0 | 0 | 1 | Up |
| F | 1 | 0 | 1 | 1 | 1 | Tristate |
| G | 1 | 1 | 0 | 1 | 0 | Down |
| H | 1 | 1 | 1 | 0 | 0 | Tristate |

If there is no transition between the A and B samples, then A is equal to B and neither the early nor the late signal is asserted. For example, when A and B are "0" (as in rows A and C) or "1" (as in rows F and H), neither the early nor the late signal is asserted and therefore no offset information is available.

In a typical implementation of a digital PLL, the phase corrections made in response to each sampling event are very small compared to the width of a bit. Also, the input signal and the recovered clock signal contribute phase noise that has the same order of magnitude as the phase correction. During operation, the PLL drives the transition sampling location to the point where the number of early indications balances the number of late indications. This point, referred to as the "median transition point," is located at the point where the rising and falling edges of the input signal intersect. In the example of FIG. 4, the median transition point is at T.

Figures 5A, 5B:
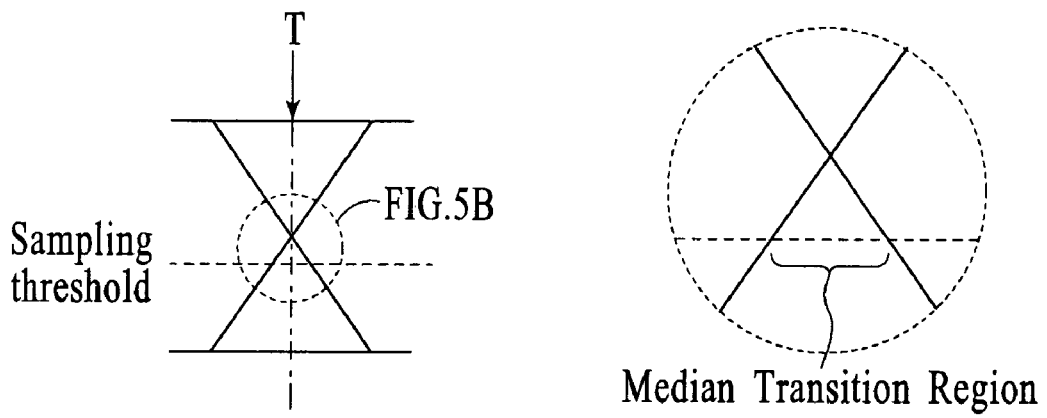
FIGS. 5A and 5B illustrate the effects of DC offset in the case where the DC offset moves the sampling threshold below the point at which rising and falling edges of an input signal intersect.

DC offset in a communications system can be contributed from various sources, such as transmitters, amplifiers, and digital phase detectors. The overall DC offset in the PLL causes the median transition point to become poorly defined. Specifically, the DC offset causes the point at which the number of early indications balances the number of late indicates (referred to herein as the "sampling threshold") to move up or down relative to the point where the rising and falling edges of the input signal intersect. As the sampling threshold changes, the median transition point becomes a median transition region. FIGS. 5A and 5B illustrate the effects of DC offset in the case where the DC offset moves the sampling threshold below the point at which rising and falling edges of the input signal intersect. When the DC offset of the sampling threshold is below the point where the rising and falling edges of the input signal intersect (as depicted in FIG. 5A), the transition samples are biased towards more 1s and when the DC offset of the sampling threshold is above the intersection point, the transition samples are biased towards more 0s.

Figure 6:
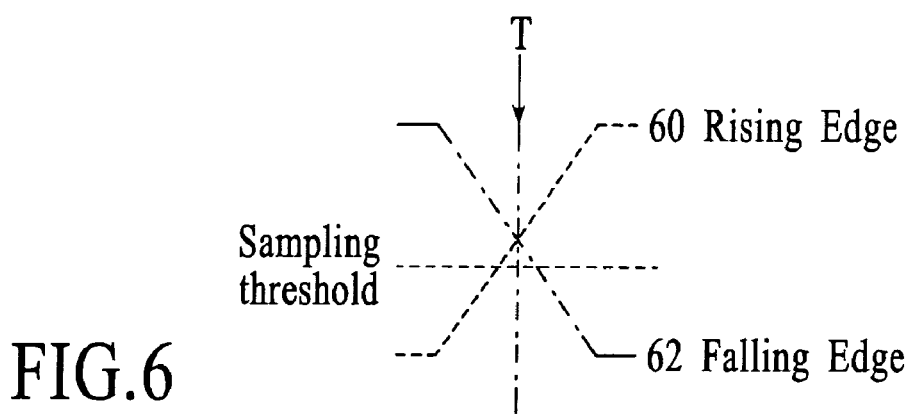
FIG. 6 shows the median region in the presence of DC offset for rising and falling edges of an input signal.

FIG. 6 shows the median region in the presence of DC offset for rising and falling edges 60 and 62 of the input signal. When the phase of the transition sampler is in the median region, the transition samples will resolve to a 1 whether the transition is a rising edge or a falling edge. While the PLL is locked, the transition sampler will be in the median transition region the majority of the time. The transition sample location will drift outside of the median transition region briefly from time to time due to phase noise from the input signal or phase noise from the VCO. Even if the PLL is not locked and the phase of the transition sampler rotates with respect to the phase of the input signal, the transition sampler will still be biased towards more 1s than 0s.

Figure 7B:
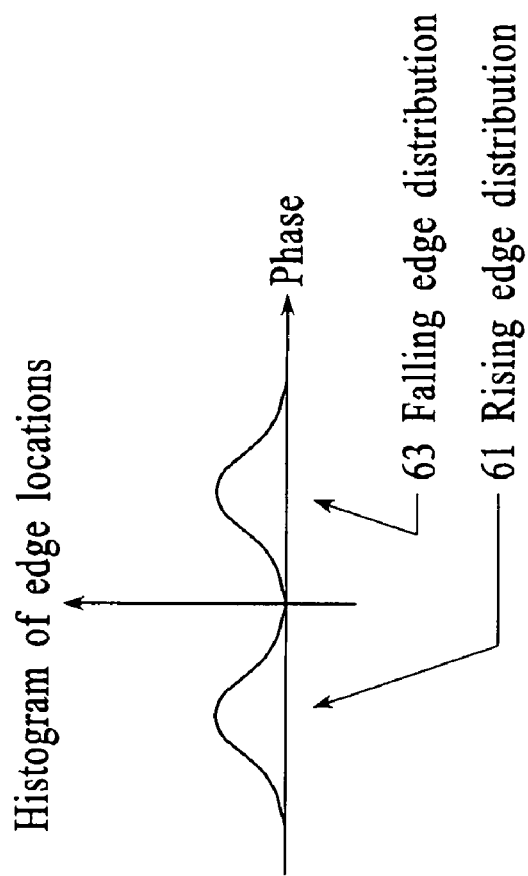
FIG. 7B depicts an example of a histogram of the rising and falling edge locations of the input signal from FIG. 7A.
Figure 7A:
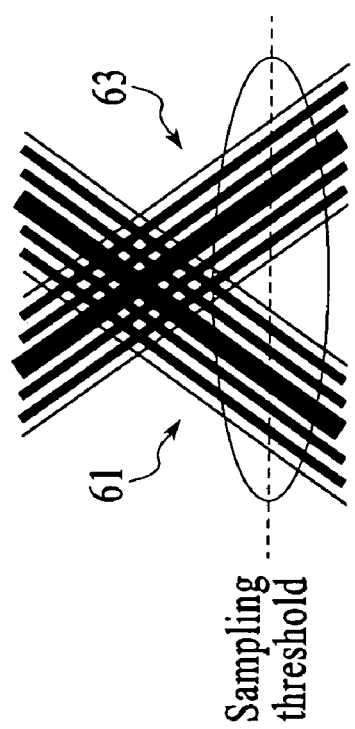
FIG. 7A depicts an example of the distribution of rising and falling edges that results from phase noise in an input signal.

Absent phase noise, the PLL is stable if the transition sample location (and therefore the phase of the recovered clock) is anywhere within the median transition region as indicated by FIGS. 5A, 5B, and 6. In reality, all VCOs produce phase noise that results in a random phase walk. For example, the phase noise of the recovered clock may walk randomly back and forth between the rising and falling edges of the input signal, only receiving a correction when it strays early of the rising or late of the falling edge. In addition to phase noise produced by the VCO, all transmission systems receive data that has some amount of phase noise. This causes the rising and falling edges 61 and 63 of the input signal, which are represented by thin lines in FIGS. 5A and 5B, to be blurred. FIG. 7A depicts an example of the distribution of rising and falling edges that results from phase noise in the input signal. FIG. 7B depicts an example of a histogram of the rising and falling edge distributions of the input signal from FIG. 7A. Even if no coherent noise sources are present, all systems will still contain thermal noise which will cause a histogram of the rising and of the falling edges to have a normal (Gaussian) distribution. The more noise in the system, the larger the standard deviation of the distribution of each edge.

In FIGS. 5B and 7A, half of the transitions are rising edges and half of the transitions are falling edges. If a histogram were constructed from FIG. 5B, it would show two narrow vertical distributions that correspond to the rising and falling edges separated by a large region with no transitions. Any point in the region between the two narrow vertical distributions would be a median point, since half the transitions would be on one side of the zero crossing and half on the other side of the zero crossing. From FIGS. 7A and 7B, it can be seen that the rising edges and falling edges 61 and 63 have a much wider distribution than in FIG. 5B. The wider distribution of the rising and falling edges fills most of the space between the average rising and average falling transition. Therefore, the space between the two distributions, which is the median region, becomes much smaller and is easier to identify relative to the median region of FIG. 5. If the distributions in the histogram of rising and falling edges overlap such that there is no space between the distributions, then the median is exactly defined. Although the median of the transition distributions becomes easier to find with more noise, it is still necessary to correct the DC offset to reduce the bimodal distribution of the rising and falling edges.

As described above with reference to FIGS. 2 and 3, to correct for the DC offset that is experienced by a PLL, the transition samples that are generated by the digital phase detector 14 are integrated over fixed intervals and the DC offset is adjusted in response to the integration. Since the DC offset causes the transition sampler to be biased in one direction, the result of the integration will be biased in the same direction. The offset correction is made in response to the direction of the bias. The certainty of the direction of the bias is increased by the integration, thereby making the system more immune to phase noise, especially phase noise that is contributed from the recovered clock signal and the input signal.

Referring back to FIG. 3, operation of the offset correction module 12 is now described in more detail. In operation, the integrator 30 of the offset correction module receives the transition samples from the digital phase detector 14. The transition samples are integrated over a fixed integration interval. The duration of the integration interval should be long enough to guarantee a sufficient number of rising and falling edges. The offset correction module of FIG. 3 relies on the data being DC balanced and therefore the integration time should be long enough to ensure that the data is DC balanced. In the embodiment of FIG. 3, the integration interval is controlled by a calibration clock. During the integration interval, the integrator accumulates the results of the transition samples. In an embodiment, the integrator is a circuit which charges or discharges a capacitor with a current proportional to its input voltage and can be implemented with a voltage controlled current source and a capacitor. The output of the integrator is compared against a threshold value 54 by the comparator 48 and at the end of each integration interval, the state machine 50 either increments or decrements a digital value based upon the sign of the comparator. For example, if the integrator output is greater than the threshold value, the state machine increments the digital value and if the integrator output is less than the threshold value, the state machine decrements the digital value. The digital value of the state machine (e.g., an N-bit word) is then provided to the DAC 52. The DAC generates the offset correction signal in response to the digital value from the state machine. In the embodiment of FIG. 3, the offset correction module adjusts the offset of the amplifier 20 to compensate for the system offset. Alternatively, the offset correction module compensates for the system offset at the transition sampler. For example, an offset correction voltage is applied to the input signal before samples are obtained. In the steady state, the system will dither back and forth around the correct DAC setting to achieve zero offset. The finer the resolution of the DAC (e.g., the wider the N-bit word), the more exactly the offset is cancelled and the smaller the effect of the dithering will be. In the embodiment of FIG. 3, the offset correction module relies on receiving an input signal that is DC balanced.

Figure 8:
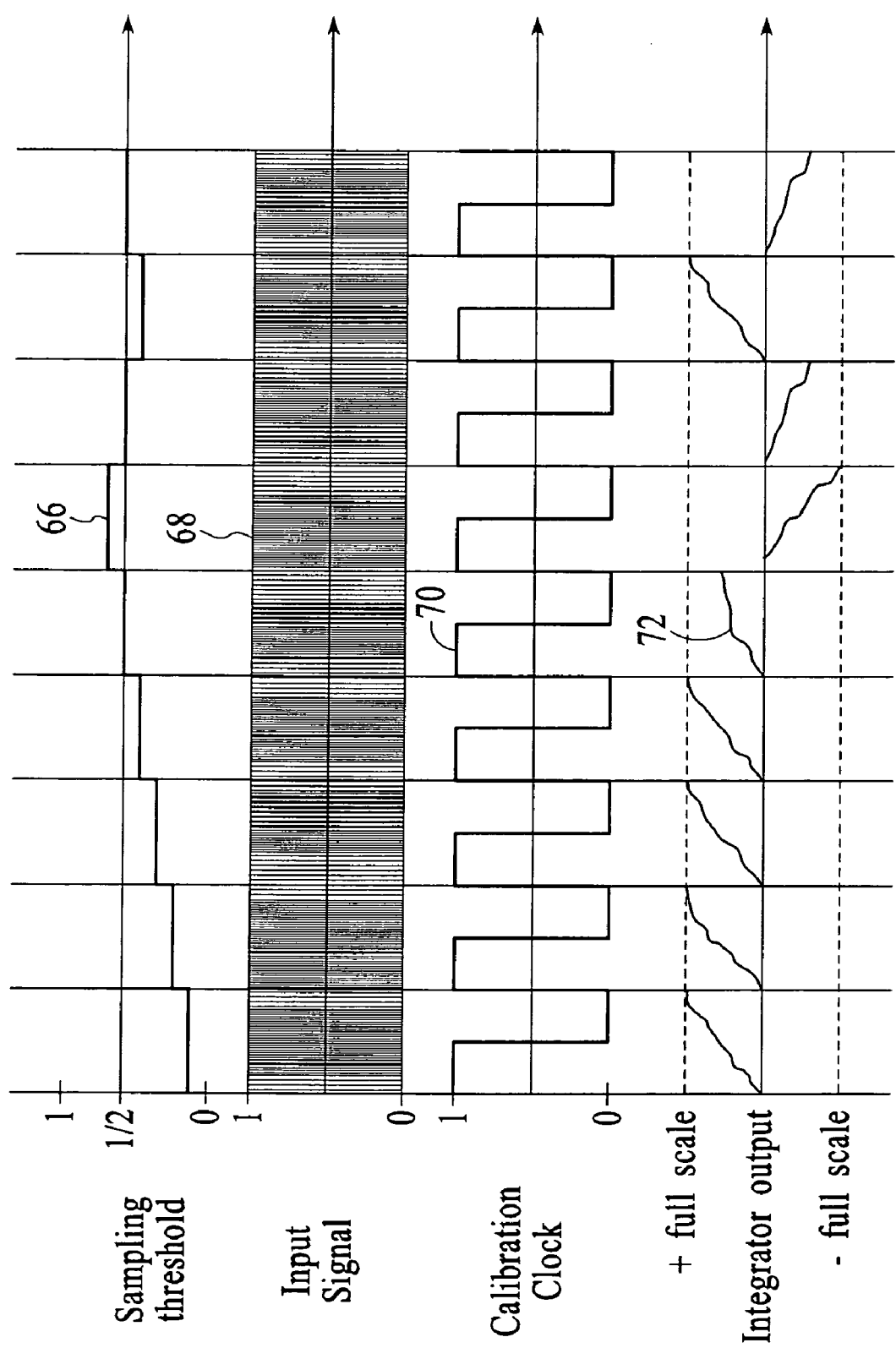
FIG. 8 is a timing diagram of an example operation of the system depicted in FIG. 3.

FIG. 8 is a timing diagram of an example operation of the system depicted in FIG. 3. The timing diagram includes waveforms for the sampling threshold 66, the input signal 68, the calibration clock 70, and the integrator output 72. In the example of FIG. 8, the system has an initial offset in which the sampling threshold is below the desired sampling threshold of ½. The initial offset causes the transition samples to be biased towards 1's. During the first integration interval, the integrator output grows positive because of the bias towards 1's. At the end of the integration interval, which corresponds to one cycle of the calibration clock, the digital value of the state machine 50 increments in response to the sign of the comparator 48. The DAC 52 receives the incremented digital value and outputs an offset correction signal in response. The DC offset is adjusted in response to the offset correction signal. As illustrated by the sampling threshold waveform in FIG. 8, at the end of the first integration period, the DC offset moves one step closer to the desired sampling threshold of ½ in response to the offset correction signal. Also, at the end of the first integration interval, the integrator is reset. The process of integrating the transition samples and adjusting the offset correction signal in response to the integration is continuously repeated such that the sampling threshold oscillates around the ideal sampling threshold of ½. The sign of the comparator will change when the bias changes towards more 0's than 1's as the sampling threshold rises above the point where the rising and falling edges intersect. The change in the sign of the comparator will drive the sampling threshold back in the opposite direction.

In the embodiment of FIG. 3, the integrator 30 is an analog integrator. In an alternative embodiment, the integrator could be implemented using a digital counter. In another embodiment, the functions of the state machine 50 and the DAC 52 could be replaced by a large integrating capacitor.

Since the output of the transition sampler 28 is data dependant, the rate at which the integrator changes will vary based on the number of 1's and 0's in the input signal, the amount of noise in the input signal, and the amount of phase noise on the recovered clock. Given a long enough integration time, an analog integrator will approach its limit. Integrator limiting is controlled by resetting the integrator at the end of each integration interval.

In the case where there is no transition present between the A and B samples, the transition sampler samples either a 1 or 0, depending on the present value of the A and B bits (which should be equal in this case). As stated above, the offset correction module 12 depicted in FIG. 3 relies on an input signal that is DC balanced over a time that is similar to the integration interval. Assuming the input signal is DC balanced over the integration interval, the effect of sampling a 1 when there is no transition is negated by the equal probability of sampling a 0 when there is no transition. If the input signal is not DC balanced over the integration interval, then the offset correction module must be configured to account for the imbalance of 1's and 0's.

Figure 9:
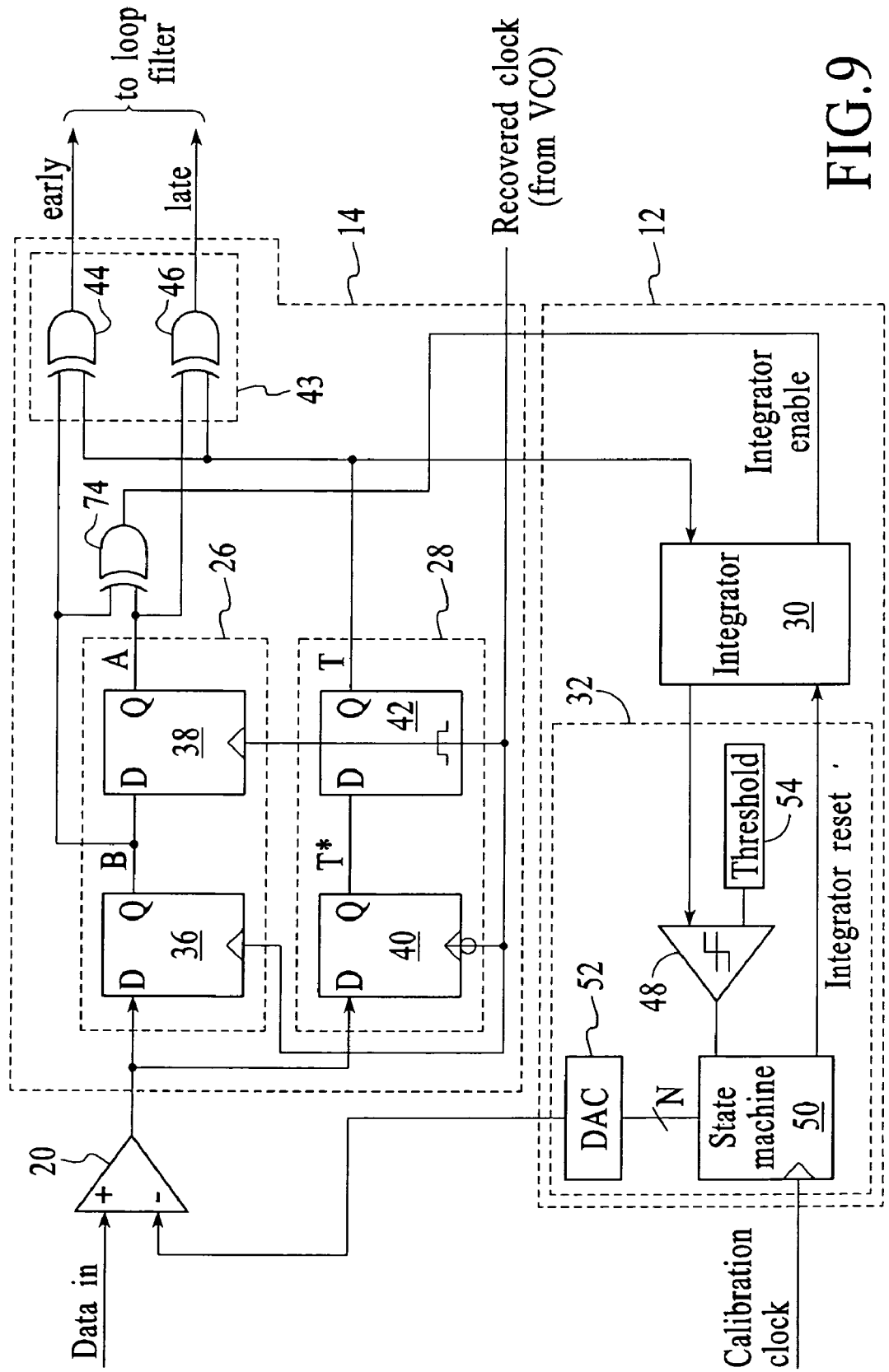
FIG. 9 depicts an expanded view of the digital phase detector and an offset correction module that is configured to integrate only the transition samples that represent actual transitions.

In an embodiment, to deal with an input signal that is not DC balanced, the offset correction module 12 distinguishes the transition samples that represent an actual transition from the transition samples that do no represent a transition (e.g., when the previous and next bit samples are the same, A=B). Only the transition samples that represent an actual transition are used in the integration. FIG. 9 depicts an expanded view of the digital phase detector 14 and an offset correction module 12 that is configured to integrate only the transition samples that represent actual transitions. The offset correction module of FIG. 9 is similar to the offset correction module of FIG. 3 except that it includes integration enable logic that enables the integrator 30 only for transition samples that represent a transition. Referring to FIG. 9, the integration enable logic includes an XOR circuit 74 that provides an integrator enable signal to the integrator only when A XOR B is true (the logic A XOR B is true only when there is a transition). By enabling the integrator only when there is a transition, the offset correction module is immune to errors caused by the transition sampler sampling long strings or large disparities of 1's or 0's.

Another advantage of the offset correction modules of FIGS. 3 and 9 is that they do not require a training sequence upon reset.

Figure 10:
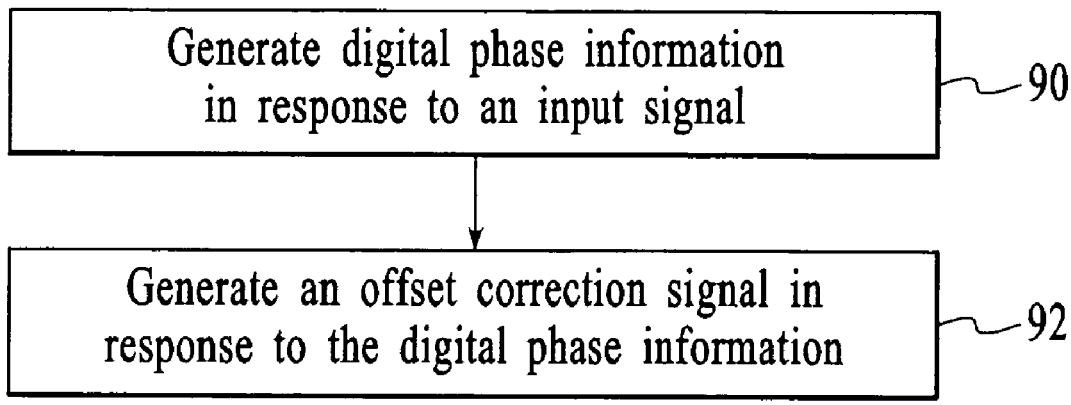
FIG. 10 is a process flow diagram of a method for correcting for DC offset in a phase locked loop.

FIG. 10 depicts a process flow diagram of a method for correcting for DC offset in a phase locked loop. At block 90, digital phase information is generated in response to an input signal. At block 92, an offset correction signal is generated in response to the digital phase information.

Figure 11:
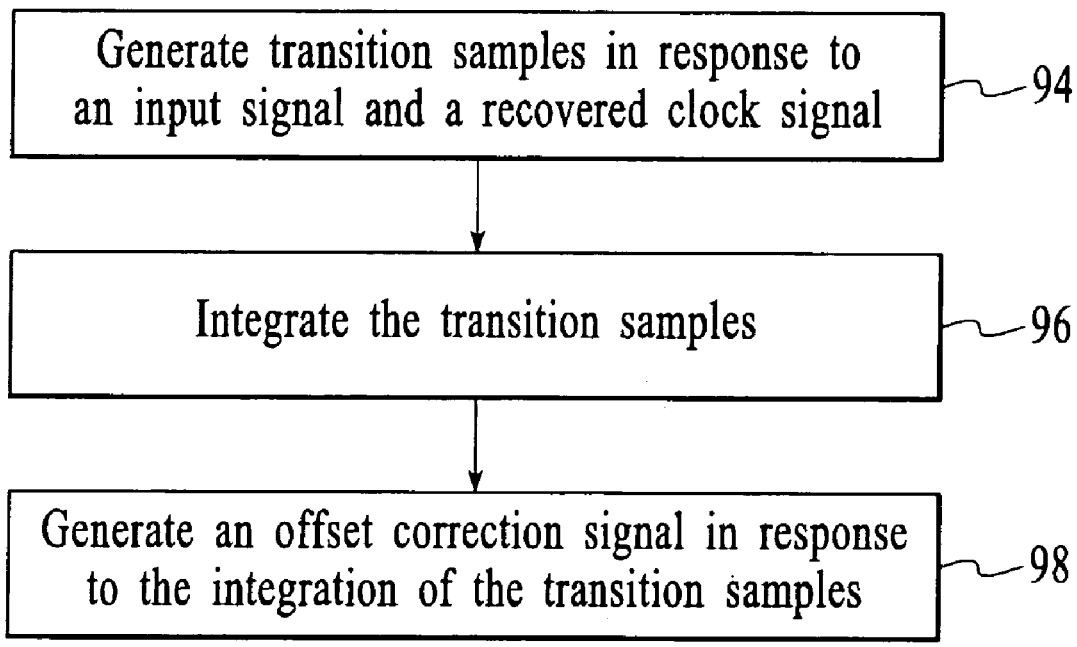
FIG. 11 is another process flow diagram of a method for correcting for DC offset in a phase locked loop.

FIG. 11 depicts another process flow diagram of a method for correcting for DC offset in a phase locked loop. At block 94, transition samples are generated in response to an input signal and a recovered clock signal. At block 96, the transition samples are integrated. At block 98, an offset correction signal is generated in response to the integration of the transition samples.

Although specific embodiments in accordance with the invention have been described and illustrated, the invention is not limited to the specific forms and arrangements of parts so described and illustrated. The invention is limited only by the claims.

What is claimed is:

1. A method for correcting for direct current (DC) offset in a phase locked loop comprising:
   generating digital phase information in response to an input signal, wherein generating the digital phase information includes generating transition samples as the digital phase information in response to the input signal and a recovered clock signal; and
   generating an offset correction signal in response to the digital phase information, wherein generating the offset correction signal includes integrating the transition samples.

2. The method of claim 1 further including integrating the transition samples only when the digital phase information indicates that a transition has occurred.

3. The method of claim 1 further including adjusting the offset correction signal in response to the integration of the transition samples.

4. The method of claim 3 further including adjusting an analog offset correction signal in response to the integration of the transition samples.

5. The method of claim 1 further including adjusting the DC level of the input signal in response to the recovered clock signal.

6. The method of claim 1 wherein the transition samples are generated in response to the input signal and the offset correction signal.

7. A system for correcting for direct current (DC) offset in a phase locked loop, the system comprising:
   a digital phase detector that generates digital phase information in response to an input signal, wherein the digital phase detector includes a transition sampler that generates transition samples as the digital phase information in response to the input signal and a recovered clock signal; and
   an offset correction module configured to receive the digital phase information from the digital phase detector and to generate an offset correction signal in response to the digital phase information, wherein the offset correction module includes an integrator that integrates the transition samples from the transition sampler.

8. The system of claim 7 further including integration enable logic configured to enable integration only when the digital phase information indicates that a transition has occurred.

9. The system of claim 7 further including an input amplifier that is connected to receive the offset correction signal from the offset correction module.

10. The system of claim 7 wherein the offset correction module further includes an offset correction signal generator that generates the offset correction signal in response to an output of the integrator.

11. The system of claim 10 wherein the offset correction signal generator includes a digital-to-analog converter (DAC) that generates an analog output signal in response to the output of the integrator.

12. The system of claim 11 wherein the offset correction signal generator additionally includes a state machine and a comparator, the comparator being connected to compare the output of the integrator to a threshold and the state machine being incremented or decremented in response to the sign of the comparator.

13. A system for correcting for direct current (DC) offset in a phase locked loop, the system comprising:
   a digital phase detector that generates digital phase information in response to an input signal, the digital phase detector including a transition sampler that generates transition samples in response to the input signal and a recovered clock signal; and
   an offset correction module comprising:
      an integrator configured to receive the transition samples from the digital phase detector and to integrate the transition samples over and integration interval; and
      an offset correction signal generator configured to generate an offset correction signal in response to the output of the integrator.

14. The system of claim 13 further including integration enable logic configured to enable the integrator only when the digital phase information indicates that a transition has occurred.

15. The system of claim 13 further including an input amplifier that is connected to receive the offset correction signal from the offset correction module.

16. The system of claim 13 wherein the offset correction signal generator includes a digital-to-analog converter (DAC) that generates an analog output signal in response to the output of the integrator.

17. The system of claim 16 wherein the offset correction signal generator includes a state machine and a comparator, the comparator being connected to compare the output of the integrator to a threshold and the state machine being incremented or decremented in response to the sign of the comparator.

* * * * *